(12) United States Patent
Ito

(10) Patent No.: US 10,911,024 B2
(45) Date of Patent: Feb. 2, 2021

(54) ACOUSTIC WAVE FILTER, ACOUSTIC WAVE DEVICE, MULTIPLEXER, AND COMMUNICATION APPARATUS

(71) Applicant: KYOCERA Corporation, Kyoto (JP)

(72) Inventor: Motoki Ito, Ikoma (JP)

(73) Assignee: KYOCERA Corporation, Kyoto (JP)

( * ) Notice: Subject to any disclaimer, the term of this patent is extended or adjusted under 35 U.S.C. 154(b) by 7 days.

(21) Appl. No.: 16/341,355

(22) PCT Filed: Oct. 24, 2017

(86) PCT No.: PCT/JP2017/038282
§ 371 (c)(1),
(2) Date: Apr. 11, 2019

(87) PCT Pub. No.: WO2018/079522
PCT Pub. Date: May 3, 2018

(65) Prior Publication Data
US 2019/0245518 A1 Aug. 8, 2019

(30) Foreign Application Priority Data

Oct. 28, 2016 (JP) .................................. 2016-211840
Dec. 15, 2016 (JP) .................................. 2016-243165

(51) Int. Cl.
*H03H 9/64* (2006.01)
*H01Q 1/50* (2006.01)
(Continued)

(52) U.S. Cl.
CPC ............ *H03H 9/6483* (2013.01); *H01Q 1/50* (2013.01); *H03H 9/02559* (2013.01);
(Continued)

(58) Field of Classification Search
CPC ............ H03H 9/6483; H03H 9/02559; H03H 9/02637; H03H 9/0576; H03H 9/145; H03H 9/25; H03H 9/72; H01Q 1/50
(Continued)

(56) References Cited

U.S. PATENT DOCUMENTS 5,914,646 A 6/1999 Hashimoto
8,462,755 B2* 6/2013 Jian ....................... H04B 1/0057
333/132
(Continued)

FOREIGN PATENT DOCUMENTS

JP H06-152317 A 5/1994
JP H7-264000 A 10/1995
(Continued)

OTHER PUBLICATIONS

"Wireless Handset Front-End Optimization", 4G Americas, Oct. 2014, pp. 1-27. (Year: 2014).*

*Primary Examiner* — Benny T Lee
*Assistant Examiner* — Hafizur Rahman
(74) *Attorney, Agent, or Firm* — Procopio Cory Hargreaves and Savitch LLP

(57) ABSTRACT

A SAW filter includes a piezoelectric substrate, a serial arm and a parallel resonance portion. The serial arm includes one or more serial resonance portions. The parallel resonance portion is located on the piezoelectric substrate and configures a ladder-type filter together with the serial arm. The parallel resonance portion includes a parallel resonator and a capacity element. The parallel resonator includes an IDT electrodes on the piezoelectric substrate and a pair of reflectors on the two sides thereof. The capacity element is connected in parallel with the parallel resonator. A capacitance of the capacity element is 0.8 time or more of a capacitance of the IDT electrode in the parallel resonator. A difference between an anti-resonance frequency and a reso-
(Continued)

nance frequency of the first parallel resonance portion is smaller than a difference between an anti-resonance frequency and a resonance frequency of the first parallel resonator.

13 Claims, 7 Drawing Sheets

(51) Int. Cl.
*H03H 9/145* (2006.01)
*H03H 9/72* (2006.01)
*H03H 9/02* (2006.01)
*H03H 9/25* (2006.01)
*H03H 9/05* (2006.01)

(52) U.S. Cl.
CPC ...... *H03H 9/02637* (2013.01); *H03H 9/0576* (2013.01); *H03H 9/145* (2013.01); *H03H 9/25* (2013.01); *H03H 9/72* (2013.01)

(58) Field of Classification Search
USPC .......................................................... 333/133
See application file for complete search history.

(56) References Cited

U.S. PATENT DOCUMENTS

| | | | |
|---|---|---|---|
| 9,608,595 B1* | 3/2017 | Raihn | H03H 9/605 |
| 2007/0024392 A1* | 2/2007 | Inoue | H03H 9/6423 |
| | | | 333/133 |
| 2008/0238572 A1 | 10/2008 | Funami et al. | |
| 2013/0109332 A1* | 5/2013 | Aigner | H03H 9/02102 |
| | | | 455/90.2 |

FOREIGN PATENT DOCUMENTS

| | | |
|---|---|---|
| JP | H08-065089 A | 3/1996 |
| JP | 2000-114923 A | 4/2000 |
| JP | 2001-345675 A | 12/2001 |
| JP | 2008-271511 A | 11/2008 |

\* cited by examiner

ACOUSTIC WAVE FILTER, ACOUSTIC WAVE DEVICE, MULTIPLEXER, AND COMMUNICATION APPARATUS

TECHNICAL FIELD

The present disclosure relates to an acoustic wave filter filtering signals by utilizing an acoustic wave, and to an acoustic wave device, a multiplexer and a communication apparatus including the acoustic wave filter. The acoustic wave is for example a surface acoustic wave (SAW).

BACKGROUND ART

As an acoustic wave filter, there is known a ladder-type filter in which a plurality of acoustic wave resonators are connected in a ladder configuration (Patent Literature 1). In Patent Literature 1, capacity portions are connected in parallel with respect to the acoustic wave resonators. Further, Patent Literature 1 alludes to the fact that an anti-resonance frequency is made closer to the resonance frequency without changing the resonance frequency by providing such capacity portions and that a difference Δf between the resonance frequency and the anti-resonance frequency can be made smaller.

CITATION LIST

Patent Literature

Patent Literature 1: Japanese Patent Publication No. 2001-345675

SUMMARY OF INVENTION

An acoustic wave filter according to one aspect of the present disclosure includes a piezoelectric substrate, a serial arm, and one or more parallel resonance portions. The serial arm includes one or more serial resonance portions on the piezoelectric substrate. The one or more parallel resonance portions are located on the piezoelectric substrate and configure a ladder-type filter together with the serial arm. A first resonance portion, which is any one among the one or more serial resonance portions and the one or more parallel resonance portions, includes a first resonator and a first capacity portion. The first resonator includes an IDT electrode on the piezoelectric substrate and a pair of reflectors on the two sides of the IDT electrode. The first capacity portion is connected in parallel with the first resonator. A capacitance of the first capacity portion is 0.8 time or more of a capacitance of the IDT electrode in the first resonator. A difference between an anti-resonance frequency and a resonance frequency of the first resonance portion is smaller than a difference between an anti-resonance frequency and a resonance frequency of the first resonator.

An acoustic wave device according to one aspect of the present disclosure includes the acoustic wave filter described above and a mounting substrate on which the acoustic wave filter is mounted. The mounting substrate includes a plurality of pads bonded to the plurality of reference potential terminals, a plurality of wiring lines connected to the plurality of pads, and a plurality of external terminals connected through the plurality of wiring lines with the plurality of pads. The plurality of pads include two pads which are not short-circuited with each other in a range from the plurality of pads up to the plurality of external terminals. One of the two reference potential terminals is connected to one of the two pads. The other of the two reference potential terminals is connected to the other of the two pads.

A multiplexer according to one aspect of the present disclosure includes an antenna terminal, a transmission filter filtering a transmission signal and outputting the result to the antenna terminal, and a receiving filter filtering a reception signal from the antenna terminal. At least one of the transmission filter and the receiving filter includes the acoustic wave filter described above.

A communication apparatus according to one aspect of the present disclosure includes an antenna, the multiplexer described above the antenna terminal of which is connected to the antenna, and an IC connected to the transmission filter and receiving filter.

DESCRIPTION OF EMBODIMENTS

Figure 1:
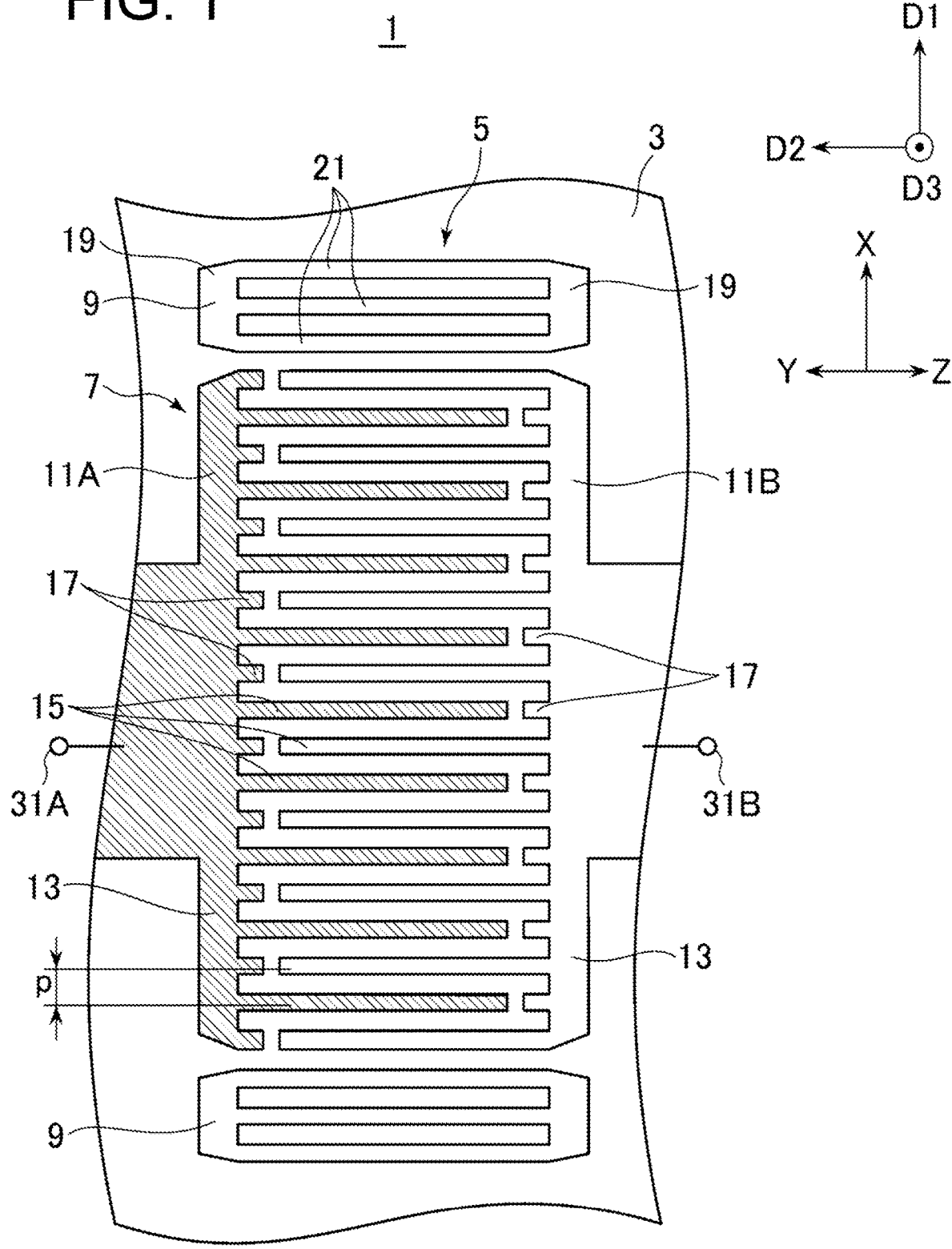
FIG. 1 is a plan view showing the configuration of a SAW resonator.

Below, an embodiment of the present disclosure will be explained with reference to the drawings. Note that, the drawings used in the following explanation are schematic ones. Size ratios etc. in the drawings do not always coincide with the actual ones.

Further, sometimes the same or similar configurations will be referred to attaching different letters to the same terms such as the "first comb-shaped electrode 11A" and "second comb-shaped electrode 11B". Further, in this case, sometimes they will be simply referred to as the "comb-shaped electrodes 11" and the two will not be differentiated.

(Configuration of SAW Resonator)

FIG. 1 is a plan view showing the configuration of a SAW resonator 1 used in a SAW filter 51 (FIG. 2) according to an embodiment.

In the SAW resonator 1 (SAW filter 51), any direction may be defined as "above" or "below". In the following explanation, however, for convenience, an orthogonal coordinate system comprised of a D1 axis, D2 axis, and D3 axis will be defined. Sometimes "upper surface" and other terms will be used where the positive side of the D3 axis (this side on the drawing sheet in FIG. 1) is the upper part. Note that, the D1 axis is defined so as to become parallel to a direction of propagation of the SAW propagating along the upper surface of the piezoelectric substrate 3 which will be explained later (the surface on this side of the drawing sheet, usually the broadest surface (major surface surface)), the D2 axis is defined so as to be parallel to the upper surface of the piezoelectric substrate 3 and perpendicular to the D1 axis, and the D3 axis is defined so as to be perpendicular to the upper surface of the piezoelectric substrate 3.

The SAW resonator 1 configures a so-called 1-port SAW resonator. For example, it causes resonation when an electrical signal having a predetermined frequency is input from one of a first terminal 31A and second terminal 31B which are schematically shown and outputs the signal which caused the resonation from the other of the first terminal 31A and second terminal 31B.

The SAW resonator 1 of such a 1-port SAW resonator has for example a piezoelectric substrate 3 and a resonator electrode portion 5 provided on the piezoelectric substrate 3. The resonator electrode portion 5 has an IDT electrode 7 and a pair of reflectors 9 positioned on the two sides of the IDT electrode 7.

The piezoelectric substrate 3 is for example configured by a single crystal having a piezoelectric characteristic. The single crystal is for example a lithium niobate ($LiNbO_3$) single crystal or lithium tantalate ($LiTaO_3$) single crystal. The cut angle may be suitably set in accordance with the type etc. of the SAW utilized. For example, the piezoelectric substrate 3 is a rotated Y-cut and X-propagated one. That is, the X-axis is parallel to the upper surface (D1 axis) of the piezoelectric substrate 3, while the Y-axis is inclined by a predetermined angle relative to the normal line of the upper surface of the piezoelectric substrate 3. Note that, the piezoelectric substrate 3 may be one which is formed relatively thin and to which a support substrate made of an inorganic material or organic material is bonded at the back surface (surface on the negative side of the D3 axis).

The IDT electrode 7 and reflectors 9 are configured by layered conductors provided on the piezoelectric substrate 3. The IDT electrode 7 and the reflector 9 are for example configured by mutually the same materials and to mutually the same thicknesses. The layered conductors configuring them are for example metal. The metal is for example Al or an alloy containing Al as the principal ingredient (Al alloy). The Al alloy is for example an Al—Cu alloy. The layered conductors may be configured by a plurality of metal layers as well. The thicknesses of the layered conductors are suitably set in accordance with electrical characteristics etc. demanded from the SAW resonator 1. As an example, the thicknesses of the layered conductors are 50 nm to 600 nm.

The IDT electrode 7 has a first comb-shaped electrode 11A (given hatching for convenience in viewing) and second comb-shaped electrode 11B. The comb-shaped electrodes 11 have bus bars 13, pluralities of electrode fingers 15 which extend parallel to each other from the bus bars 13, and pluralities of dummy electrode fingers 17 each projecting from the bus bar 13 between the two or more electrode fingers 15. The pair of comb-shaped electrodes 11 are arranged so that the pluralities of electrode fingers 15 intermesh (intersect) with each other. That is, the two bus bars 13 in the pair of comb-shaped electrodes 11 are arranged so as to face each other, and the electrode fingers 15 in the first comb-shaped 11A and the electrode fingers 15 in the second comb-shaped electrode 11B are basically alternately aligned in the width direction thereof. Further, the plurality of dummy electrodes in one comb-shaped 11 face at their tip ends with the tip ends of the electrode fingers 15 in the other comb-shaped electrode 11.

The bus bars 13 are for example substantially formed in long shapes so as to linearly extend in a direction of propagation of the SAW (D1 axis direction) with constant widths. Further, the pair of bus bars 13 face each other in a direction (D2 axis direction) perpendicular to the direction of propagation of the SAW. Note that, the bus bars 13 may be changed in the widths or inclined relative to the direction of propagation of the SAW.

The electrode fingers 15 are for example substantially formed in long shapes so as to linearly extend in the direction (D2 axis direction) perpendicular to the direction of propagation of the SAW with constant widths. The plurality of electrode fingers 15 are for example aligned in the direction of propagation of the SAW. Further, they have equal lengths to each other. Note that, the IDT electrode 7 may be so-called apodized so that the lengths of the plurality of electrode fingers 15 (intersecting widths from another viewpoint) change according to the positions in the propagation direction.

The number of the electrode fingers 15 may be suitably set in accordance with the electrical characteristics etc. demanded from the SAW resonator 1. Note that, FIG. 1 etc. are schematic views, therefore a smaller number of electrode fingers 15 are shown. In actuality, a larger number (for example 100 or more) electrode fingers 15 than those shown in the view may be aligned. The same is true for the later explained strip electrodes 21 in the reflectors 9.

A pitch "p" of the plurality of electrode fingers 15 (electrode finger pitch) is for example made substantially constant over the entire IDT electrode 7. Note that, the pitch "p" is for example a distance between the centers of mutually neighboring two electrode fingers 15 (or strip electrodes 21 which will be explained later). The pitch "p" is basically set to a half of the wavelength λ ($p=λ/2$) of the SAW having an equal frequency to the frequency at which resonation is desired to be caused in the SAWs propagating on the piezoelectric substrate 3.

The pluralities of dummy electrodes 17 are for example substantially formed in long shapes so as to linearly project to the direction (D2 axis direction) perpendicular to the direction of propagation of the SAW with constant widths. A gap between the tip end thereof and the tip end of each of the plurality of electrode fingers 15 is for example equal among the plurality of dummy electrodes 17. The width, number, and pitch of the plurality of dummy electrodes 17 are equal to those of the plurality of electrode fingers 15. Note that, the width of the dummy electrodes 17 may be different from the electrode fingers 15 as well.

Further, the IDT electrode 7 may also be one not having dummy electrodes 17. In the following explanation, sometimes explanation and illustration of the dummy electrodes 17 will be omitted.

Each reflector 9 is for example formed in a lattice shape. That is, the reflector 9 has a pair of bus bars 19 facing each other and pluralities of strip electrodes 19 which extend between the pair of bus bars 19.

The shapes of the bus bars 19 and strip electrodes 21 may be made the same as the bus bars 13 and electrode fingers 15 in the IDT electrode 7 except that the two ends of each strip electrode 21 are connected to the pair of bus bars 19.

For example, the bus bars 19 are substantially formed in long shapes so as to linearly extend in the direction of propagation of the SAW (D1 axis direction) with constant widths. The strip electrodes 21 are substantially formed in long shapes so as to linearly extend in the direction (D2 axis direction) perpendicular to the direction of propagation of the SAW with constant widths. Further, the plurality of strip electrodes 21 are for example aligned in the direction of propagation of the SAW. Further, they have equal lengths to each other. The width and pitch of the plurality of strip electrodes 21 are for example equal to the width and pitch of the plurality of electrode fingers 15.

The number of the plurality of strip electrodes 21 is for example set so that the reflectivity of the SAW in a mode designed for use becomes substantially 100% or more. The theoretical necessary minimum number is for example several to about 10. Usually, it is set to 20 or more, or set to 30 or more providing a safety margin.

The pair of reflectors 9 are for example adjacent to the two sides of the IDT electrode 7 in the direction of propagation of the SAW. Accordingly, the pluralities of strip electrodes 21 are aligned continuing from the arrangement of the plurality of electrode fingers 15. The pitch between a strip electrode 21 and an electrode finger 15 which are adjacent to each other between a reflector 9 and the IDT electrode 7 is for example equal to the pitch of the plurality of electrode fingers 15.

Note that, although not particular shown, the upper surface of the piezoelectric substrate 3 may be covered by a protective film comprised of $SiO_2$ or the like from the tops of the IDT electrode 7 and reflectors 9 as well. The protective film may be one for simply suppressing corrosion of the IDT electrode 7 etc. or may be one contributing to temperature compensation. Further, in a case where the protective film is provided or another case, on the upper surfaces or lower surfaces of the IDT electrode 7 and reflectors 9, addition-films configured by insulators or metal may be provided in order to improve the reflection coefficient of the SAW.

When voltage is supplied to the pair of comb-shaped electrodes 11, voltage is supplied to the piezoelectric substrate 3 by the electrode fingers 15, and a SAW in a predetermined mode propagating in the direction of the D1 axis along the upper surface is excited in the vicinity of the upper surface of the piezoelectric substrate 3. The excited SAW is mechanically reflected by the electrode fingers 15. As a result, a standing wave having the pitch of the electrode fingers 15 as a half wavelength is formed. The standing wave is converted to an electrical signal having the same frequency as that of the standing wave and is extracted by the electrode fingers 15. In this way, the SAW resonator 1 functions as the resonator. The resonance frequency thereof is substantially the same frequency as the frequency of the SAW propagating on the piezoelectric substrate 3 while having the pitch of the electrode fingers as a half wavelength.

The SAW excited in the IDT electrode 7 is mechanically reflected by the strip electrodes 21 in the reflectors 9. Further, the mutually neighboring strip electrodes 21 are connected to each other by the bus bars 19, therefore the SAW from the IDT electrode 7 is reflected by the strip electrodes 21 electrically as well. Due to this, dispersion of the SAW is suppressed and a strong standing wave stands in the IDT electrode 7, so the function of the SAW resonator 1 as the resonator is improved.

In the IDT electrode 7, for improvement of characteristics or fine adjustment, sometimes a pitch of electrode fingers having a size different from the pitch of most of the electrode fingers is set in a portion thereof (for example less than 50% or less than 5% of the total number of the electrode fingers). For example, in the IDT electrode 7, at the two sides of the direction of propagation of the SAW, sometimes a narrow pitch portion having a smaller electrode finger pitch than that in the other most parts is provided. Further, for example, sometimes so-called thinning is carried out so that one to about tens (for example three) of the alternately aligned electrode fingers 15 in the pair of comb-shaped electrodes 11 are removed or a change of the width or arrangement of the electrode fingers 15 which is substantially equivalent to the former is carried out. When simply referred to as the "pitch" in the present disclosure, the pitch in such a unique portion is excluded. Further, in the case that the pitch fluctuates within a very small range over the entire IDT electrode 7, a mean value thereof may be used.

(SAW Filter)

Figure 2:
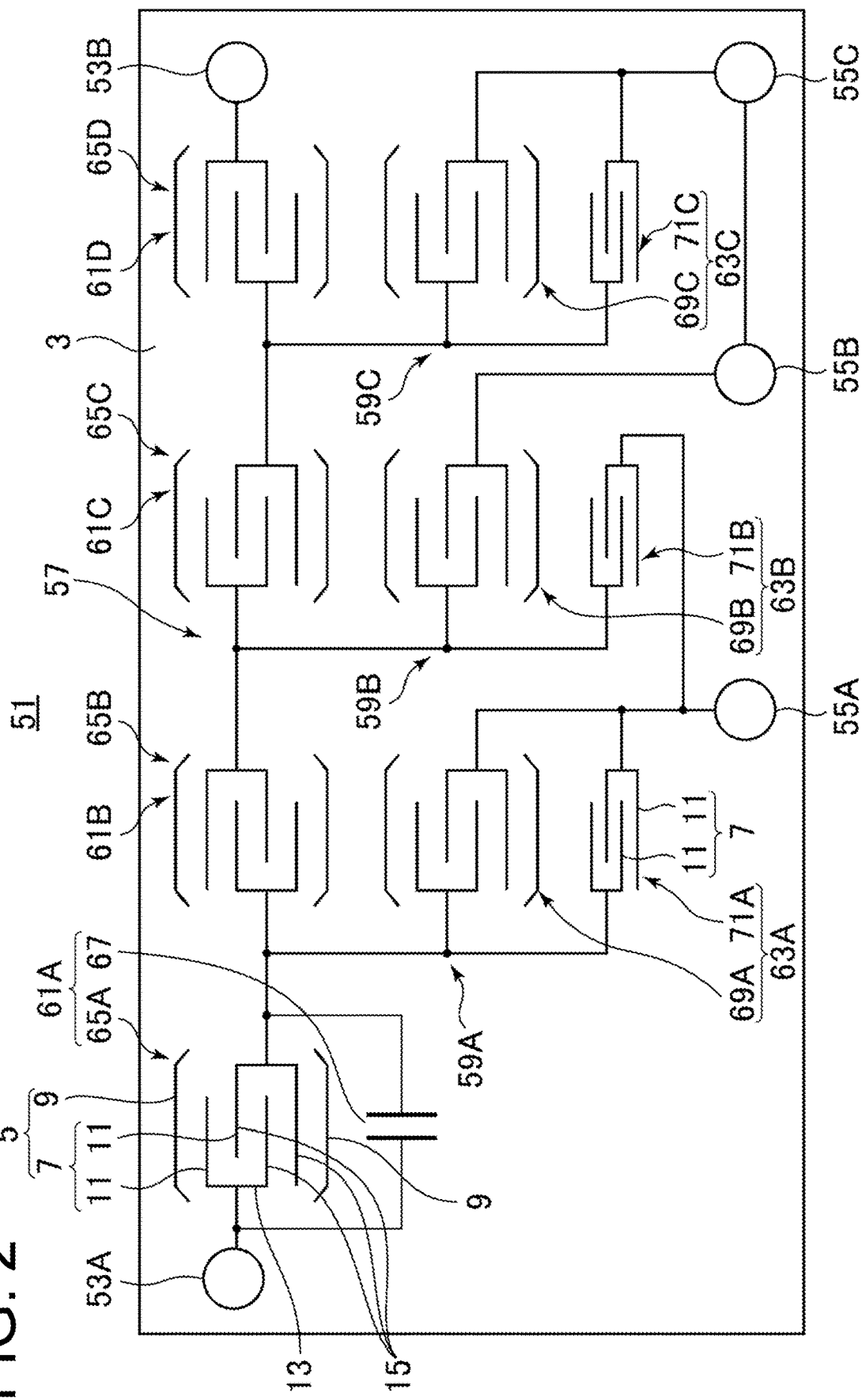
FIG. 2 is a plan view schematically showing the configuration of a SAW filter including the SAW resonator in FIG. 1.

FIG. 2 is a plan view schematically showing the configuration of a SAW filter 51 including the SAW resonator 1. In this view, as understood from the notations of the resonator electrode portion 5, IDT electrode 7, reflectors 9, comb-shaped electrodes 11, bus bars 13, and electrode fingers 15 shown on the left top side on the drawing sheet, these conductors are further schematically shown than those in FIG. 1.

The SAW filter 51 for example has the already explained piezoelectric substrate 3 and two terminals 53 (first terminal 53A and second terminal 53B) which are positioned on the piezoelectric substrate 3. The SAW filter 51 filters a signal input to one of the two terminals 53 and outputs the result from the other of the two terminals 53.

Further, the SAW filter 51 has one or more GND terminals 55 (first GND terminal 55A to third GND terminal 55C in the example shown) which are positioned on the piezoelectric substrate 3 and are grounded (given the reference potential). Unwanted components (signals out of the passband) among the signals about to flow between the two terminals 53 are made to flow to the GND terminals 55.

The terminals 53 and GND terminals 55 are configured by layered conductors which are positioned on the upper surface of the piezoelectric substrate 3. Specific numbers, shapes, and sizes of these and the positions on the upper surface of the piezoelectric substrate 3 may be suitably set.

The SAW filter 51, in order to perform the filtering as described above, has a serial arm 57 connecting the two terminals 53 and one or more parallel arms 59 (first parallel arm 59A to third parallel arm 59C in the example shown) connecting the serial arm 57 and the GND terminals 55. That is, the SAW filter 51 is a ladder-type filter having the serial arm 57 and one or more parallel arms 59 which are connected in a ladder configuration. The signal in the passband flows through the serial arm 57 from one of the two terminals 53 to the other, and the signals out of the passband flow through the parallel arms 59 to the GND terminals 55.

The serial arm 57 includes a plurality of serial resonance portions 61 (first serial resonance portion 61A to fourth serial resonance portion 61D in the example shown) which are connected in series between the first terminal 53A and the second terminal 53B. Note that, the number of the serial resonance portions 61 included in the serial arm may be one as well.

The number of the parallel arms 59 may be one or more. In the following description, a case of two or more will be taken as an example. The plurality of parallel arms 59 are connected to the serial arm 57 at the positions which are electrically different from each other.

The positions which are electrically different from each other in the serial arm 57 referred to here indicates that the relative relationships with respect to the serial resonance portions 61 included in the serial arm 57 are different from each other. For example, the position between the first serial resonance portion 61A and the second serial resonance portion 61B and the position between the second serial resonance portion 61B and the third serial resonance portion 61C are different from each other. Conversely, for example, so far as the positions are ones between the first serial resonance portion 61A and the second serial resonance portion 61B (including the connection point on the second serial resonance portion 61B side of the first serial resonator 65A and the capacity element 67 which will be explained later), any positions in the wiring line connecting the two are the electrically the same (common) positions.

Each parallel arm 59 has the parallel resonance portion 63 connecting the serial arm 57 and the GND terminal 55 (first parallel resonance portion 63A to third parallel resonance portion 63C in the example shown).

Each of the serial resonance portions 61 and parallel resonance portions 63 has for example a resonance frequency at which the impedance takes the minimum value and an anti-resonance frequency at which the impedance takes the maximum value and the frequency is higher than the resonance frequency. Further, for the serial resonance portions 61 and parallel resonance portions 63, the resonance frequencies and anti-resonance frequencies are set so that the resonance frequency of the serial resonance portion 61 and the anti-resonance frequency of the parallel resonance portion 63 substantially coincide. Due to this, using a range which is somewhat narrower than the frequency range between the resonance frequency of the parallel resonance portion 63 and the anti-resonance frequency of the serial resonance portion 61 as the passband, the signal flowing from one of the two terminals 53 to the other can be filtered.

(Resonance Portion)

Each of the plurality of serial resonance portions 61 for example includes at least the serial resonator 65 (first serial resonator 65A to fourth serial provide 65D in the example shown). Further, any of the plurality of serial resonance portions 61 (first serial resonance portion 61A in the example shown) may include a capacity element 67 which is connected in parallel to the serial resonator 65 as well.

The plurality of parallel resonance portions 63 for example respectively include at least parallel resonators 69 (first parallel resonator 69A to third parallel resonator 69C in the example shown). Further, any of the plurality of parallel resonance portions 63 (all parallel resonance portions 63 in the example shown) may include a capacity element 71 connected in parallel to this parallel resonator 69 as well (first capacity element 71A to third capacity element 71C).

The serial resonators 65 and the parallel resonators 69 for example have the same configurations as those of the SAW resonator 1 explained with reference to FIG. 1. That is, each of the serial resonators 65 and parallel resonators 69 has a piezoelectric substrate 3 and a resonator electrode portion 5 (IDT electrode 7 and reflectors 9) provided on the piezoelectric substrate 3. However, specific values such as the number of the electrode fingers 15, length of the electrode fingers 15 and/or pitch "p" are set in accordance with the characteristics demanded from each resonator. In the following description, sometimes the serial resonator 65 and the parallel resonator 69 will be referred to as the "SAW resonators 1" without differentiating the two.

The serial resonator 65 and the parallel resonator 69 are provided on the same major surface of the same piezoelectric substrate 3. From another viewpoint, the serial resonator 65 and the parallel resonator 69 have parts of the piezoelectric substrate 3 and resonator electrode portions 5 provided on the same. The ranges of arrangement thereof are defined according to the resonator electrode portions 5. Note that, in the following description, for convenience, sometimes the term of "resonator" will be used in the same meaning as the term "resonator electrode portion".

The capacity element 67 is connected in parallel with respect to the first serial resonator 65A. Further, in each parallel resonance portion 63, the capacity element 71 is connected in parallel with respect to the parallel resonator 69.

The parallel connection between the capacity element and the SAW resonator 1 (IDT electrode 7) is for example a state where one of the two electrodes configuring the capacity element and one of the two comb-shaped electrodes 11 in the SAW resonator 1 are connected and where the other of the two electrodes configuring the capacity element and the other of the two comb-shaped electrodes 11 in the SAW resonator 1 are connected. Note that, such a connection will be sometimes referred to as a "parallel connection in a narrow sense".

However, in the present disclosure, the parallel connection may be a theoretical parallel connection as will be explained later. In the parallel resonance portion 63, the two electrodes in the capacity element 71 and the two comb-shaped electrodes 11 in the parallel resonator 69 need not be connected as described above.

When the capacity element is connected in parallel with respect to the SAW resonator 1, for example, this corresponds to an increase of the damping capacitance defining the anti-resonance frequency (frequency of parallel resonation) in a double resonance circuit which is equivalent to the SAW resonator 1. From this, for example, the anti-resonance frequency of the SAW resonator 1 becomes lower. Consequently, a frequency difference Δf between the resonance frequency and the anti-resonance frequency becomes smaller. In other words, the Δf of the resonance portion (61A or 63) including the capacity element (67 or 71) becomes smaller than the Δf of the SAW resonator 1 included in this resonance portion.

The serial resonance portion 61 and/or parallel resonance portion 63 may include a not shown inductor as well. In this case, the resonance frequency also changes. However, in the present embodiment, the inductance of the inductor is set so that the Δf of the resonance portion (61, 63) becomes larger than the Δf of the SAW resonator 1 included in this resonance portion, and the capacitance of the capacity element (67, 71) is set so that the Δf of the resonance portion (61, 63) becomes smaller than the Δf of the SAW resonator 1 included in this resonance portion. Unlike the present embodiment, in part or entirety, the Δf of the resonance portion may be set to the Δf or more of the SAW resonator 1 included in that resonance portion as well.

The term "parallel arm 59" is used in comparison with the term "serial arm 57". However, in the present disclosure, the parallel arm 59 and the parallel resonance portion 63 have the same meaning. For example, when the parallel arm 59 includes an electronic element exerting an influence upon the resonance characteristic of the parallel arm 59, this electronic element is included in the parallel resonance portion 63. Accordingly, the Δf of the parallel arm 59 and Δf of the parallel resonance portion 63 are synonymous. Further, in the serial arm 57, when an inductor is provided in series between the two serial resonators 65, with which serial resonator 65 that inductor configures the serial resonance portion 61 can be judged by grasping for example the position of connection of the parallel arm 59 as a boundary between the serial resonance portions 61.

In FIG. 2, various connections are carried out by schematically shown wiring lines. However, for example, the connections may be carried out by the bus bars 13 being directly connected and the wiring lines may be omitted.

(Configuration of Capacity Element)

The capacity element 67 or 71 has a pair of electrodes facing each other. This pair of electrodes is for example configured by conductor layers provided on the piezoelectric substrate 3. The pair of electrodes may be for example rectangular shapes with single sides facing each other or may be a pair of comb-shaped electrodes 11 arranged so as to intermesh with each other (IDT electrode 7).

In the present embodiment, as indicated by notations in the first capacity element 71A, the capacity element 71 in the parallel resonance portion 63 is configured by a pair of comb-shaped electrodes 11. By configuring the capacity element 71 by the pair of comb-shaped electrodes 11, it becomes easy to make the capacitance larger with respect to the area of the capacity element 71.

The capacity element 71 having the pair of comb-shaped electrodes 11 need not have a resonance characteristic based on the propagation of the SAW, therefore need not have the same configuration as the SAW resonator 1. Accordingly, for example, the capacity element 71 need not have reflectors 9 as illustrated or, unlike FIG. 2, may have reflectors 9 positioned on the two sides of the IDT electrode 7. Further, the capacity element 71 may have dummy electrodes 17 or may not have them. Further, the pitch of the IDT electrode 7 in the capacity element 71 may greatly deviate from a half wavelength of the SAW, may be close, may be constant, or may not be constant. When the pitch is not constant, it may fluctuate within a relatively large range (for example, a range of ±30% or more of the averaged pitch). Further, the pitch may regularly fluctuate or may irregularly fluctuate. Note that, the case where the reflectors 9 and/or dummy electrodes 17 are not provided is for example advantageous for reducing the size.

The pitch "p" of the IDT electrode 7 in the capacity element 71 is made for example relatively small. Due to this, for example, the capacitance of the capacity element 71 can be made larger relative to the area of the capacity element 71. Specifically, for example, the pitch "p" of the capacity element 71 is smaller than the pitch "p" of the SAW resonator 1 which is connected in parallel with this capacity element 71 (here, the parallel resonator 69). More specifically, for example, the former may be set to 0.9 time or less or 0.6 time or less of the latter.

The capacity element 67 of the serial resonator 61 also may be configured by a pair of comb-shaped electrodes 11 in the same way as the capacity element 71. Accordingly, the above explanation for the pair of comb-shaped electrodes 11 in the capacity element 71 may be applied to the capacity element 67.

(Capacitance of Capacity Element)

The capacitance of the capacity element 71 of the parallel resonance portion 63 is for example made relatively large. For example, the capacitance of the capacity element 71 is 0.8 time or more or 1 time or more of the capacitance of the IDT electrode 7 in the SAW resonator 1 which is connected in parallel with this capacity element 71 (here, parallel resonator 9).

Note that, the capacitance of the IDT electrode 7 in the SAW resonator 1 or capacity element referred to here is an actual capacitance which is determined according to the facing area of the pair of comb-shaped electrodes 11 (facing length when viewed on a plane×electrode thickness) and a dielectric constant of the piezoelectric substrate 3 or the like. That is, this is not an equivalent capacitance when representing the SAW resonator 1 by an equivalent circuit such as a double resonance circuit.

In general, in the design of the SAW filter 51, first, the serial resonator 65 and parallel resonator 69 (SAW resonator 1) are designed. Further, when the desired characteristics are not obtained in the SAW resonator 1 from simulation computations or experiments, provision of a capacity element which is connected in parallel to the SAW resonator 1 is studied and, further, the capacitance thereof is set. As a result, usually the capacitance of the capacity element 71 becomes a relatively small value and does not become a relatively large value as described above.

In the present embodiment, by increasing the capacitance of the capacity element 71 as described above, from another viewpoint, by considering the capacitance of the capacity element 71 from an initial stage of design of the parallel resonator 69, for example the area of the parallel resonance portion 63 can be made small. This is because, as described above, in the capacity element 71, the pitch can be made small, the dummy electrodes 71 are not necessary and/or the reflectors 9 are not necessary and the like.

The capacity element 67 of the serial resonance portion 61 is for example made relatively small. For example, the capacitance of the capacity element 67 is less than 0.8 time or less than 1 time of the capacitance of the SAW resonator 1 which is connected in parallel with this capacity element 67 (here, serial resonator 65). In other words, a ratio ($C_{67}/C_{65}$) of the capacitance ($C_{67}$) of the capacity element 67 connected in parallel to the serial resonator 65 relative to the capacitance ($C_{65}$) of the IDT electrode 7 in this serial resonator 65 is smaller than a ratio ($C_{71}/C_{69}$) of the capacitance ($C_{71}$) of the capacity element 71 connected in parallel to the parallel resonator 69 relative to the capacitance ($C_{69}$) of the IDT electrode 7 in this parallel resonator 69. In this case, it is easy to reduce the influence of the drop of impedance at the anti-resonance frequency accompanying the increase of capacitance exerted upon the filter characteristic.

However, unlike the above explanation, the capacitance of the capacity element 71 may be made relatively small (for example $C_{71}/C_{69}<1$ or 0.8), the capacitance of the capacity element 67 may be made relatively large (for example $C_{67}/C_{65}\geq 1$ or 0.8), or the ratio ($C_{67}/C_{65}$) may be made larger than the ratio ($C_{71}/C_{69}$).

(Method for Connecting Parallel Resonance Portion)

In each of the first parallel resonance portion 63A and third parallel resonance portion 63C, the parallel resonator 69 and the capacity element 71 are connected by the parallel connection in a narrow sense as explained above. That is, one of the pair of comb-shaped electrodes 11 in the parallel resonator 69 and one of the pair of comb-shaped electrodes 11 in the capacity element 71 are connected, and the other of the pair of comb-shaped electrodes 11 in the parallel resonator 69 and the other of the pair of comb-shaped electrodes 11 in the capacity element 71 are connected. Further, from another viewpoint, the parallel resonator 69 and the capacity element 71 are connected to the same GND terminal 55.

On the other hand, in the second parallel resonance portion 63B, one of the pair of comb-shaped electrodes 11 in the second parallel resonator 69B and one of the pair of comb-shaped electrodes 11 in the second capacity element 71B are connected (on the serial arm 57 side), but the other of the pair of comb-shaped electrodes 11 in the second parallel resonator 69B and the other of the pair of comb-shaped electrodes 11 in the second capacity element 71B are not connected (on the GND terminal 55 side). From another viewpoint, the other of the pair of comb-shaped electrodes 11 in the second parallel resonator 69B and the other of the pair of comb-shaped electrodes 11 in the second capacity element 71B are connected to the GND terminals 55 which are different from each other.

Accordingly, the second parallel resonator 69B and the second capacity element 71B are not connected in parallel in a narrow sense. However, the plurality of GND terminals 55 are all given the reference potential, therefore basically are intended to have the same potentials as each other. Accordingly, it can be regarded that the second parallel resonator 69B and the second capacity element 71B are connected in parallel. Further, conventionally, such a connection is handled as one type of parallel connection. Therefore, in the present disclosure, when referred to as the "parallel connection", unless indicated otherwise, an aspect where the parallel resonator 69 and the capacity element 71 are connected to GND terminals 55 which are different from each other is included.

The first GND terminal 55A and the second GND terminal 55B are not short-circuited. That is, the first GND terminal 55A and the second GND terminal 55B are not connected without passing through a resonance portion, resistor, inductor and/or capacity element (except ones inevitably included in wiring lines) (the two terminals are connected by only wiring lines), although the two terminals are connected by a route passing through the first parallel resonance portion 63A, second serial resonance portion 61B, and second parallel resonance portion 63B.

On the other hand, in the second parallel resonance portion 63B, the second parallel resonator 69B is connected to the second GND terminal 55B, and the second capacity element 71B is connected to the first GND terminal 55A. Accordingly, the second parallel resonator 69B and the second capacity element 71B are connected to the two GND terminals 55 which are not short-circuited with each other, therefore they are electrically separated up to the GND terminals 55.

Note that, if an wiring line connecting the wiring line between the second parallel resonator 69B and the second GND terminal 55B and the wiring line between the second capacity element 71B and the first GND terminal 55A were provided and parallel connection in a narrow sense were carried out between the second parallel resonator 69B and the second capacity element 71B, naturally the first GND terminal 55A and the second GND terminal 55B would be short-circuited. Accordingly, the case of saying "the first GND terminal 55A and the second GND terminal 55B are not short-circuited" paradoxically is predicated on a parallel connection in a narrow sense not being carried out between the second parallel resonator 69B and the second capacity element 71B which are connected to these terminals 55A and 55B.

The second GND terminal 55B and the third GND terminal 55C are for example short-circuited through an wiring line (notation is omitted). Accordingly, for example, in the third parallel resonance portion 63C, it can be said that the third parallel resonator 69C and the third capacity element 71C are connected in parallel in a narrow sense, even if the third parallel resonator 69C and the third capacity element 71C are not connected by only an wiring line, but the third parallel resonator 69C is connected to the third GND terminal 55C and the third capacity element 71C is connected to the second GND terminal 55B.

The parallel resonator 69 and the capacity element 71 which are connected in parallel with each other, with respect to the serial arm 57 side, only have to be connected at positions the same as (common with) each other with respect to the serial arm. The meaning of the "same position" is already explained. For example, rather than the first parallel resonator 69A and the first capacity element 71A being connected to the serial arm 57 after being connected with each other as illustrated, they may be connected between the first serial resonance portion 61A and the second serial resonance portion 61B separately from each other.

Note that, unlike the illustration, the first GND terminal 55A and the second GND terminal 55B may be short-circuited, the second GND terminal 55B and the third GND terminal 55C need not be short-circuited, or the second parallel resonator 69B and the second capacity element 71B may be connected to the same GND terminal 55.

(Multiplexer)

Figure 3A:
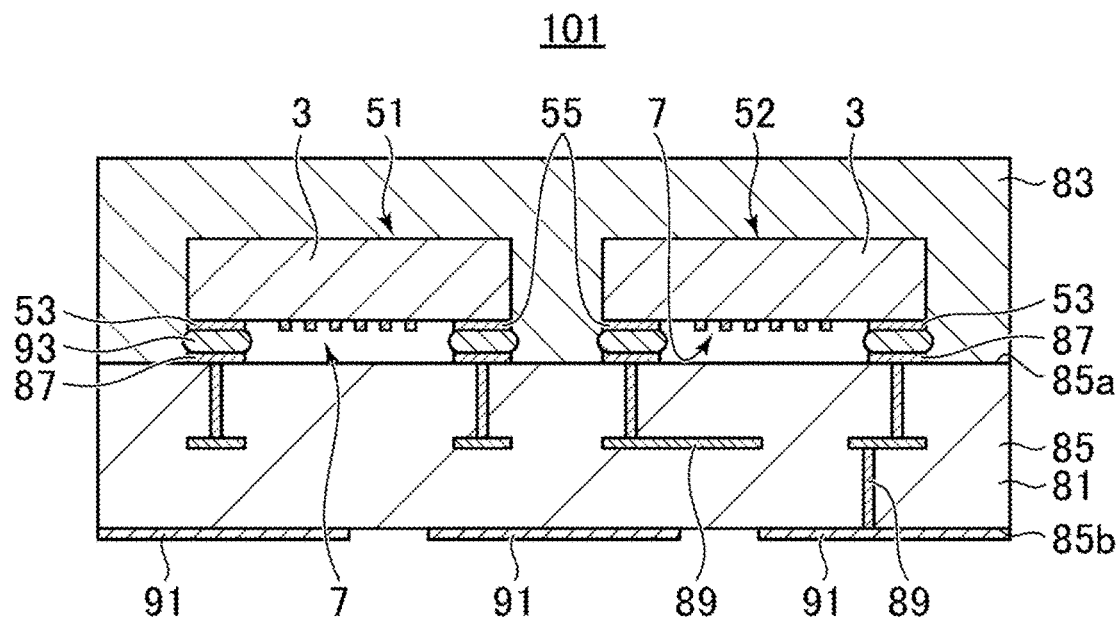
FIG. 3A is a cross-sectional view schematically showing a multiplexer including the SAW filter in FIG. 2.

FIG. 3A is a cross-sectional view schematically showing a multiplexer 101 as an example of utilization of the SAW filter 51.

The multiplexer 101 is for example a duplexer branching a transmission signal and a reception signal. In this branching, use is made of the SAW filter 51 as the filter filtering the transmission signal or reception signal.

The multiplexer 101 is for example a substantially rectangular cuboid shaped electronic part and has external terminals 91 which are exposed on at least one surface 85B thereof. Further, for example, the multiplexer 101 is utilized mounted on a not shown circuit board by bonding the external terminals 91 and the lands of the not shown circuit board.

The multiplexer 101 has for example a mounting substrate 81, a SAW filter 51 and SAW filter 52 which are mounted on the mounting substrate 81, and a sealing resin 83 for sealing these filters.

The mounting substrate 81 has for example an insulating substrate 85, a plurality of pads 87 provided on the insulating substrate 85, wiring lines 89, and the above external terminals 91. The pads 87 are for example configured by conductive layers which are positioned on one surface 85a of the insulating substrate 85. Each wiring line 89 is configured including any of a conductive layer positioned in an internal portion and/or on the surface of the insulating substrate 85 and a via conductor penetrating through part or all of the insulating substrate 85. The external terminals 91 are for example configured by conductive layers positioned on the other surface 85b of the insulating substrate 85. The pads 87 and the external terminals 91 are connected by wiring lines 89.

Between the SAW filters 51 and 52, for example one functions as a filter filtering the transmission signal and the other functions as a filter filtering the reception signal. The configuration of the SAW filter 51 is as already explained. The SAW filter 52, for example, in the same way as the SAW filter 51, has a piezoelectric substrate 3, one or more IDT electrodes 7, terminals 53 and GND terminals 55 positioned on the piezoelectric substrate 3. However, the filter configured by the IDT electrode 7 may be a ladder-type filter the same as the SAW filter 51 or may be another form (for example, a multimode filter).

The SAW filters 51 and 52 are for example arranged so that their surfaces provided with the terminals 53 and GND terminals 55 are made to face the surface 85a of the mounting substrate 81 and are mounted on the mounting substrate 81 so that they are spaced apart by a predetermined clearance from the surface 85a by bonding these terminals 53 to the pads 87 of the mounting substrate 81 by bumps 93.

The sealing resin 83 covers the SAW filters 51 and 52 from an opposite side to the mounting substrate 81 and seals the clearance between the SAW filters 51 and 52 and the mounting substrate 81. This clearance becomes a vacuum state or a state where an inert gas is sealed and contributes to facilitation of propagation of the SAW (vibration of the piezoelectric substrate 3).

Figure 3B:
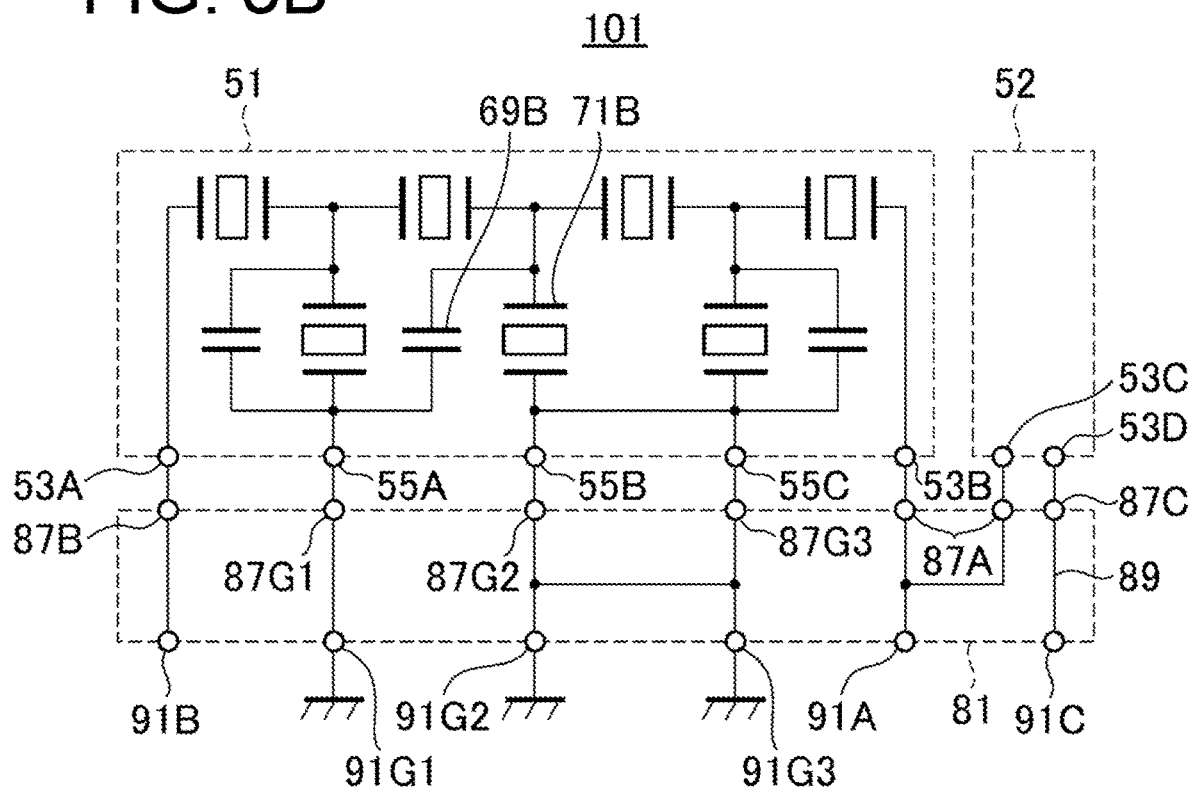
FIG. 3B is a view schematically showing a portion of a circuit in the multiplexer.

FIG. 3B is a view schematically showing a portion of the circuit in the multiplexer 101. Note that, in this view, the pads 87 and external terminals 91 shown in FIG. 3A are given additional notations A to C and G1 to G3 (sometimes simply referred to as G as well). Further, additional notations C and D are attached to the terminals 53 in the SAW filter 52.

The external terminal 91A is connected to a not shown antenna here and is connected through the two pads 87A to the second terminal 53B in the SAW filter 51 and the terminal 53C in the SAW filter 52. That is, the external terminal 91A is connected to the two of the SAW filters 51 and 52.

The external terminal 91B is used for one of the input of the transmission signal and the output of the reception signal and is connected through the pad 87B to the first terminal 53A in the SAW filter 51. Note that, the roles of the first terminal 53A and the second terminal 53B in the SAW filter 51 may be vice versa. The external terminal 91C is provided for the other of the input of the transmission signal and the output of the reception signal and is connected through the pad 87C to the terminal 53D in the SAW filter 52.

The external terminals 91G (91G1 to 91G3) are given the reference potential from an external portion (connected to an external reference potential portion) and are connected through the pads 87G (87G1 to 87G3) to the GND terminals 55 in the SAW filter 51 and the GND terminals 55 in the SAW filter 52 (not shown here).

The first GND terminal 55A and the second GND terminal 55B which were not short-circuited with each other in the SAW filter 51 are connected to the pads 87G1 and 87G2 on the mounting substrate 81. Here, the pads 87G1 and 87G2 are not short-circuited in the mounting substrate 81 (in other words, until reaching the external terminals 91G). Accordingly, the electrodes on the GND terminals 55 side in the second parallel resonator 69B and second capacity element 71B are not short-circuited in a range from these electrodes up to the external terminals 91, and consequently parallel connection in a narrow sense is not carried out even in the entire multiplexer 101.

(Communication Apparatus)

Figure 4:
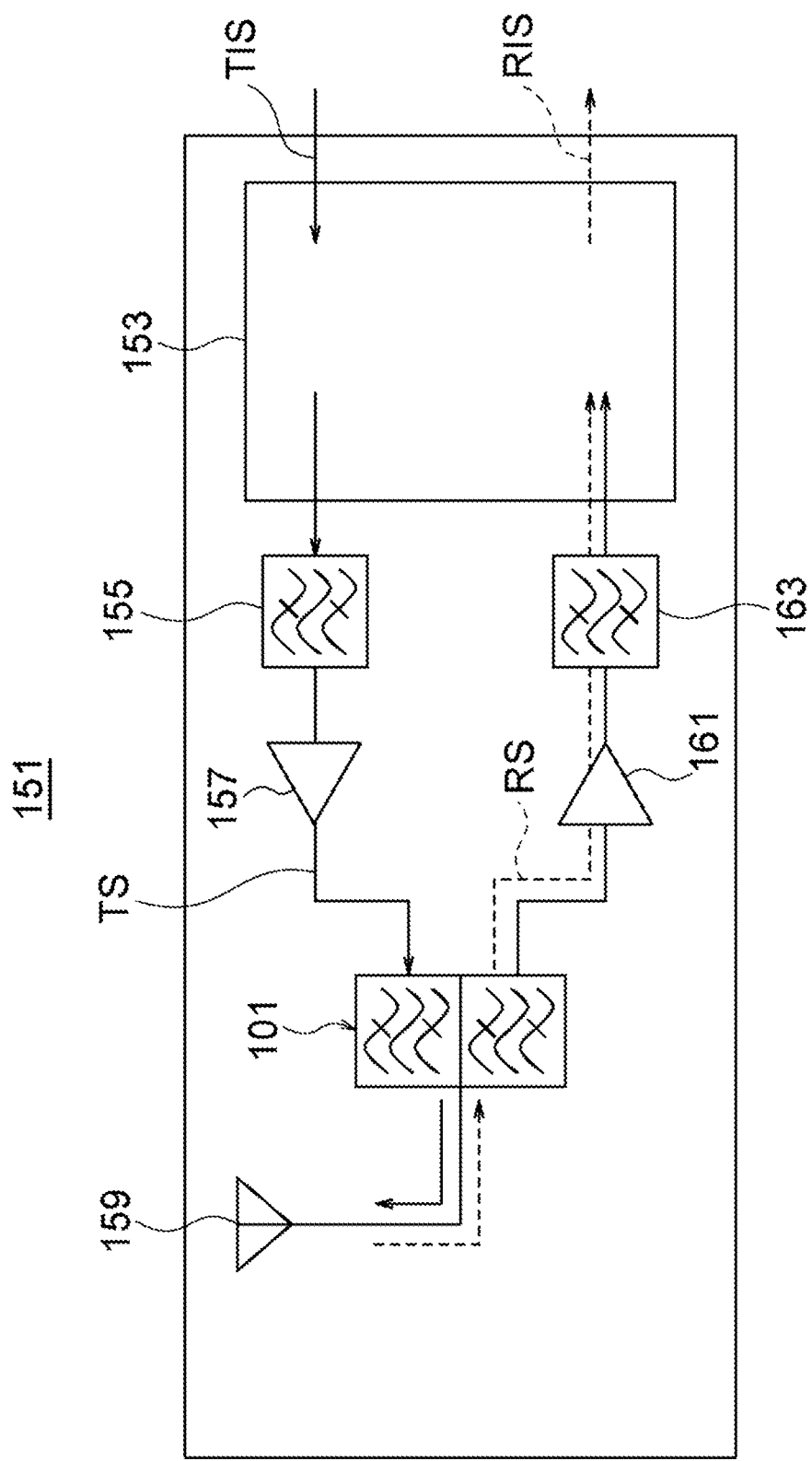
FIG. 4 is a schematic view showing a communication apparatus including the multiplexer in FIG. 3.

FIG. 4 is a block diagram showing a principal part of a communication apparatus 151 as an example of utilization of the multiplexer 101 explained above.

In the communication apparatus 151, a transmission information signal TIS including the information to be transmitted is modulated and raised in frequency (converted to a high frequency signal having a carrier frequency) by the RF-IC (radio frequency integrated circuit) 153 to form a transmission signal TS. The transmission signal TS is stripped of unwanted components out of the transmission-use passing band by a bandpass filter 155, amplified by an amplifier 157, and input to the multiplexer 101 (one of the external terminals 91B and 91C). Further, the multiplexer 101 strips the unwanted components out of the transmission-use passing band from the input transmission signal TS and outputs the stripped transmission signal TS from the external terminal 91A to an antenna 159. The antenna 159 converts the input electrical signal (transmission signal TS) to a wireless signal (radio wave) and transmits the result.

Further, in the communication apparatus 151, the wireless signal (radio wave) received by the antenna 159 is converted to an electrical signal (reception signal RS) by the antenna 159 and is input to the multiplexer 101 (external terminal 91A). The multiplexer 101 strips the unwanted components out of the reception-use passing band from the input reception signal RS and outputs the result from the other of the external terminals 91B and 91C to an amplifier 161. The output reception signal RS is amplified by an amplifier 161 and is stripped of the unwanted components out of the reception-use passing band by a bandpass filter 163. Further, the reception signal RS is lowered in frequency and demodulated by the RF-IC 153 to thereby form a reception information signal RIS.

Note that, the transmission information signal TIS and reception information signal RIS may be low frequency signals (baseband signals) including suitable information. For example, they are analog audio signals or digitalized audio signals. The passing band of the wireless signal may be one according to UMTS (universal mobile telecommunications system) or other various standards. The modulation system may be phase modulation, amplitude modulation, frequency modulation, or any combination of two or more among them. As the circuit system, a direct conversion system was exemplified in FIG. 4. However, a suitable system other than that may be employed. For example, it may be a double super heterodyne system as well. Further, FIG. 4 schematically shows only the principal part. Therefore, a low pass filter or isolator etc. may be added to a suitable position. Further, the position of the amplifier or the like may be changed as well.

(Results of Simulation Computations)

Simulation computations were performed by assuming various values as the capacitance ratio ($C_{71}/C_{69}$) of the capacity element 71 relative to the capacitance of the parallel resonator 69, and the influence of the capacitance ratio ($C_{71}/C_{69}$) exerted upon the filter characteristics was checked. Note that, the capacitance ratio ($C_{71}/C_{69}$) was set common to all of the parallel resonance portions 63.

Figure 5A:
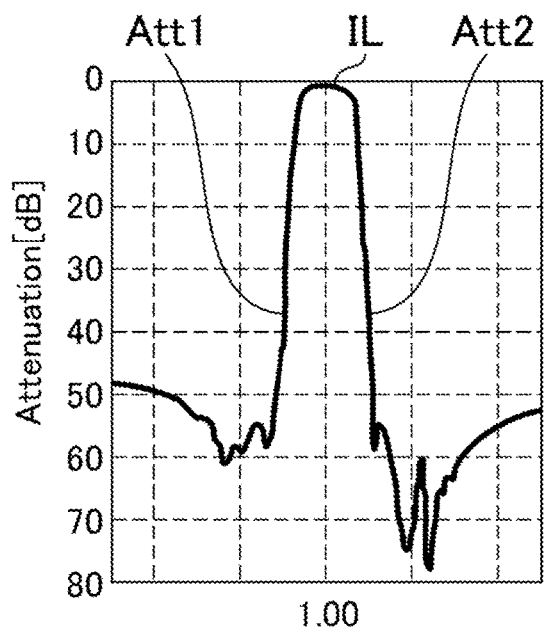
FIG. 5A, FIG. 5B, FIG. 5C, and FIG. 5D are views showing results of simulation computations.

FIG. 5A is a graph showing an example of the filter characteristics of the SAW filter 51 in the embodiment. In this graph, an abscissa shows normalized frequencies. In the abscissa, 1.00 indicates the center frequency of the passband. An ordinate shows attenuation amounts (dB).

This simulation computation result is one for the SAW filter 51 set to a capacitance ratio ($C_{71}/C_{69}$) of 0.8 or more. In the present embodiment, unlike the conventional device, the ratio of capacitance is set relatively large (for example 0.8 or more or 1.0 or more). However, even in such a case, as indicated in this graph, it was confirmed that the characteristics of the ladder-type filter were obtained.

Here, as shown in this graph, as indicators of evaluation of the filter characteristics, a pass characteristic IL (dB) at the center frequency, a pass characteristic Att1 (dB) at a frequency on the side somewhat lower than the center frequency by a predetermined width Wf1, and a pass characteristic Att2 (dB) at a frequency on the side somewhat higher than the center frequency by a predetermined width Wf2 will be used.

It may be said that if the pass characteristic IL is small, the insertion loss is small. It may be said that if the pass characteristic Att1 is large, the attenuation characteristic on a low frequency side is steep. It may be said that if the pass characteristic Att2 is large, the attenuation characteristic on a high frequency side is steep.

In actual design, the widths Wf1 and Wf2 are suitably set based on knowhow etc. of various manufacturers in accordance with the specifications of the communication system and characteristics demanded by customers. Here, as Wf1 and Wf2, the bandwidth of the passband will be used.

Figure 5B:
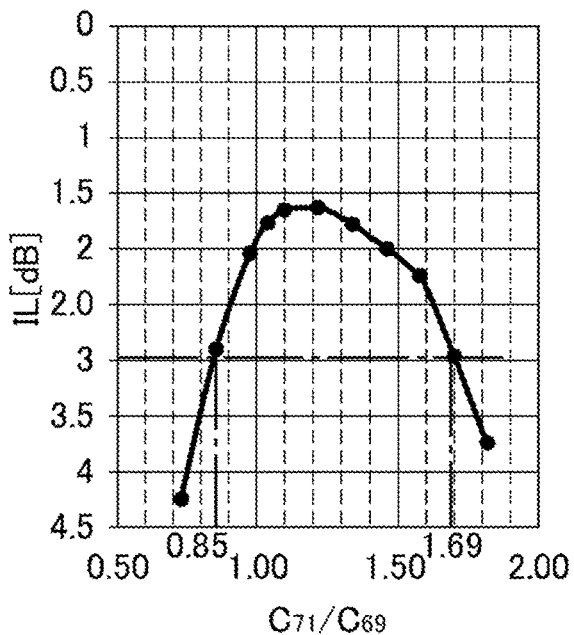
Figure 5C:
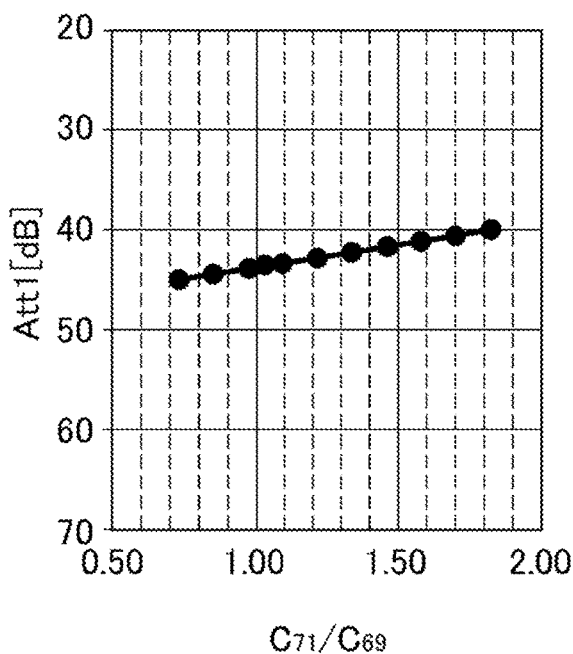
Figure 5D:
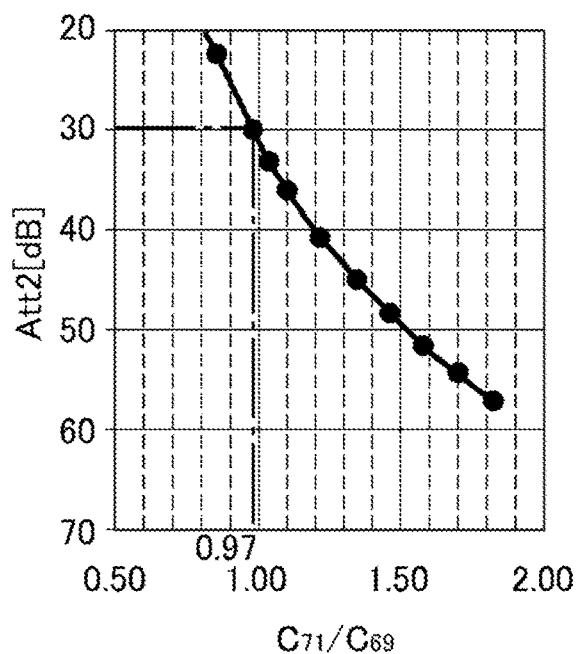

FIG. 5B to FIG. 5D are graphs showing results obtained by finding the indicator values described above according to simulation computations while changing only the ratio of capacitance ($C_{71}/C_{69}$) to various values. In each graph, the abscissa shows the ratio of capacitance ($C_{71}/C_{69}$). The ordinate shows IL, Att1, or Att2 (attenuation amount).

As shown in FIG. 5B, in the attenuation amount IL, the ratio of capacitance ($C_{71}/C_{69}$) becomes 3 dB or less in a range from 0.85 to 1.69. On the other hand, in general, the attenuation amount IL is desired to fall in a range not more than 3 dB in many cases. Accordingly, it was confirmed that the generally demanded attenuation amount IL could be realized even if the ratio of capacitance was set relatively large.

As shown in FIG. 5C, the attenuation amount Att1 becomes 40 dB or more for all of the capacitance ratios ($C_{71}/C_{69}$) covered by the computations. Further, as shown in FIG. 5D, the attenuation amount Att2 becomes 30 dB or more in the range of the ratio of capacitance of 0.97 or more. By experiments, so far as the attenuation amounts Att1 and Att2 are 30 dB or more, in many cases, the specifications requested from the SAW filter are satisfied. Accordingly, it was confirmed that the generally demanded attenuation amounts Att1 and Att2 could be realized even if the ratio of capacitance was made relatively large.

As shown in FIGS. 5C and 5D, the ratios of change of the attenuation amount Att1 and Att2 (rates of change, gradients) relative to the change of the capacitance ratio (Cn/C69) become substantially constant in these graphs where dB was plotted on the ordinates. On the other hand, the rate of change of the attenuation amount IL becomes larger in absolute value near 1.60 (gradient becomes sharp). This can be considered to be caused by the following reason: If the ratio of capacitance is made large, not only does the anti-resonance frequency move to a low frequency side, but also the impedance at the anti-resonance frequency falls, therefore the influence thereof more strongly appears on the attenuation amount IL than the attenuation amounts Att1 and Att2. Accordingly, with respect to the ratio of capacitance, for example the capacity element 71 (or 67) may be designed considering 1.60 as the upper limit value or considering if the pass characteristic is 3 dB or less and considering 1.69 as the upper limit value. Naturally, the ratio of capacitance may be set by a value larger than those as well.

(Example of Estimation of Reduction of Area)

As already explained, by making the capacitance of the capacity element 71 relatively large, the area of the parallel resonance portion 63 can be reduced. An example of the estimation will be shown below.

First, as comparative examples, suppose examples configuring the parallel resonance portion 63 by only the parallel resonator 69 without providing a capacity element 71. As such comparative examples, Cases 1 to 3 in which the capacitances $C_A$ of the IDT electrodes 7 and the pitches $p_A$ of the IDT electrodes 7 were different from each other were assumed. The areas $S_A$ of the parallel resonators 69 thereof were estimated. The results of estimation are as follows.

|  | $C_A$ (pF) | $p_A$ (μm) | $S_A$ (μm²) |
| --- | --- | --- | --- |
| Case 1 | 8.0 | 2.643 | 122883 |
| Case 2 | 6.8 | 2.637 | 99238 |
| Case 3 | 7.5 | 2.632 | 114507 |

Next, suppose examples configuring a parallel resonance portion 63 by a parallel resonator 69 and capacity element 71 as in the embodiments. Further, the capacitance $C_B$ of the parallel resonator 69 and the capacitance $C_C$ of the capacity element 71 are set so that the capacitance of the parallel resonance portion 63 as a whole becomes the capacitance $C_A$ in Cases 1 to 3 described above ($C_A=C_B+C_C$). Further, the pitch $P_B$ of the parallel resonator 69 is set to the pitch $p_A$ in the above Cases 1 to 3 ($p_B=p_A$), while the pitch $p_C$ of the capacity element 71 is set smaller than the pitch $p_B$. Specifically, they were set as follows.

|  | $C_B$ (pF) | $C_C$ (pF) | $C_C/C_B$ | $p_C$ (μm) | $p_C/p_B$ |
| --- | --- | --- | --- | --- | --- |
| Case 1 | 4.0 | 4.0 | 1.00 | 1.5 | 0.568 |
| Case 2 | 3.2 | 3.6 | 1.13 | 1.5 | 0.569 |
| Case 3 | 3.0 | 4.5 | 1.50 | 1.5 | 0.570 |

Further, under $C_B$, $C_C$, $p_B$, and $p_C$ described above, the surface $S_B$ of the parallel resonator 69 and the area $S_C$ of the capacity element 71 were estimated, and a total area $S_B+S_C$ of them was compared with the area $S_A$ in the comparative examples. The results of estimation are as follows.

|  | $S_B$ (μm²) | $S_C$ (μm²) | $S_{B+C}$ (μm²) | $S_{B+C}/S_A$ |
| --- | --- | --- | --- | --- |
| Case 1 | 56404 | 24168 | 80572 | 0.656 |
| Case 2 | 49619 | 21470 | 71089 | 0.716 |
| Case 3 | 42491 | 26502 | 68993 | 0.603 |

It was confirmed from the above results that the area of the entire parallel resonance portion 63 could be made smaller by making the capacitance of the capacity element 71 relatively larger. Specifically, in this example of estimation, by controlling the ratio of capacitance ($C_C/C_B$) to 1 or more, compared with the case where a capacity element 71 was not provided, the area of the parallel resonance portion 63 could be reduced to about 70% or less.

As described above, in the present embodiment, for example, the SAW filter 51 has the piezoelectric substrate 3, the serial arm 57 including one or more serial resonance portions 61 positioned on the piezoelectric substrate 3, and one or more parallel resonance portions 63 (parallel arms 59) which are positioned on the piezoelectric substrate 3 and configure the ladder-type filter together with the serial arm 57. The first parallel resonance portion 63A, which is any one among one or more serial resonance portions 61 and one or more parallel resonance portions 63, has the first parallel resonator 69A including the IDT electrodes 7 etc. and the first capacity elements 71A connected in parallel with the first parallel resonator 69A. The capacitance of the first capacity element 71A is 0.8 time or more of the capacitance of the IDT electrode 7 in the first parallel resonator 69A. The difference Δf between the anti-resonance frequency and the resonance frequency of the first parallel resonance portion 63A is smaller than the difference Δf between the anti-resonance frequency and the resonance frequency of the first parallel resonator 69A.

Accordingly, for example, improvement of the degree of steepness of the attenuation area of the filter and/or realization of a narrow passband is facilitated. Further, for example, the capacity element 71 is not additionally designed after designing the parallel resonator 69. By considering a capacity element 71 having a relatively large capacitance in the design from the start, the area of the parallel resonance portion 63 can be reduced as shown in the example of estimation and consequently the SAW filter 51, the multiplexer 101, and/or communication apparatus 151 can be reduced in size.

Further, in the present embodiment, for example, a resonance portion having a relatively the capacity element 71 of which the capacitance is relatively large as described above is one of the one or more parallel resonance portions 63.

In this case, for example, compared with the case where it is intended to reduce the area by making the capacitance of the capacity element 67 large in the serial resonance portion 61 (this case is also included in the art of the present disclosure), it is easier to reduce the influence of the drop of the impedance at the anti-resonance frequency accompanying an increase of capacitance exerted upon the filter characteristics.

Further, in the present embodiment, for example, the first serial resonance portion 61A, which is one of the one or more serial resonance portions 61, has the first serial resonator 65A including the IDT electrode 7 etc. and the capacity element 67 which is connected in parallel with the first serial resonator 65A. The ratio of the capacitance of the capacity element 67 relative to the capacitance of the IDT electrode 7 in the first serial resonator 65A is smaller than the ratio of the capacitance of the first capacity element 71A relative to the capacitance of the IDT electrode 7 in the first parallel resonator 69A.

In this case, for example, it becomes easy to obtain the effect of reducing the influence of the drop of the impedance at the anti-resonance frequency accompanying an increase of the capacitance exerted upon the filter characteristics as explained above.

Further, in the present embodiment, the SAW filter 51 further has a plurality of GND terminals 55 positioned on the piezoelectric substrate 3. The plurality of GND terminals include two GND terminals 55 (55A and 55B) which are not short-circuited with each other. The second parallel resonator 69B is connected to the second GND terminal 55B. The second capacity element 71B which is connected in parallel with the second parallel resonator 69B (the connection positions with respect to the serial arm 57 are common) is connected to the first GND terminal 55A.

In this case, for example, the second parallel resonator 69B and the second capacity element 71B are connected in parallel in theory. However, in an actual product, they are connected to different routes respectively having resistances, inductances and/or capacitances in the wiring lines which are all different from each other. Further, for example, a plurality of attenuation poles of serial resonation are generated in accordance with the plurality of routes. As a result, for example it becomes possible to improve the attenuation characteristic by the plurality of attenuation poles without increasing the number of parallel resonators 69.

Further, the multiplexer 101 in the present embodiment has the SAW filter 51 in which the second parallel resonator 69B and the second capacity element 71B are not short-circuited within the filter and the mounting substrate 81 on which the SAW filter 51 is mounted. The mounting substrate 81 has the plurality of pads 87 which are bonded to the plurality of GND terminals 55, the plurality of wiring lines 89 connected to the plurality of pads 87, and the plurality of external terminals 91 which are connected through the plurality of wiring lines 89 to the plurality of pads 87. The plurality of pads 87 include two pads 87G1 and 87G2 which are not short-circuited with each other in the range from the plurality of pads 87 to the plurality of external terminals 91. One of the above two GND terminals 55 which is not short-circuited as described above (55A) is connected to the pad 87G1, and the other (55B) of the two GND terminals 55 is connected to the pad 87G2.

Accordingly, the isolation of the first GND terminal 55A and the second GND terminal 55B is improved, and the effect of the plurality of attenuation poles explained above is improved. From another viewpoint, the second parallel resonator 69B and the second capacity element 71B are connected to the different routes without causing short-circuiting until the external terminals 91, therefore a difference of resonance characteristics of the two routes is apt to become larger and consequently a plurality of attenuation poles are apt to appear.

(Verification of Effect by Separation of Ground: Results of Simulation Computations)

As explained above, according to the present embodiment, the resonator and the capacity element which is connected in parallel to the resonator are connected to different reference potentials on the piezoelectric substrate 3. Specifically, when focusing on the second parallel resonance portion 63B in the SAW filter 51, the second parallel resonator 69B and the second capacity element 71B are connected to different GND terminals 55 (55A and 55B). In this way, in order to confirm the effect due to connecting the parallel resonator 69 and the capacity element 71 which are parallel-connected to one parallel arm 59 to different GND terminals 55, a model of the SAW filter 51 having the configuration shown in FIG. 2 was prepared, and the frequency characteristic was simulated.

Further, as a modification, a model of a SAW filter in which the second parallel resonator 69B and the second capacity element 71B were connected to the same GND terminal 55 was prepared, and the frequency characteristic was simulated in the same way.

Figure 7:
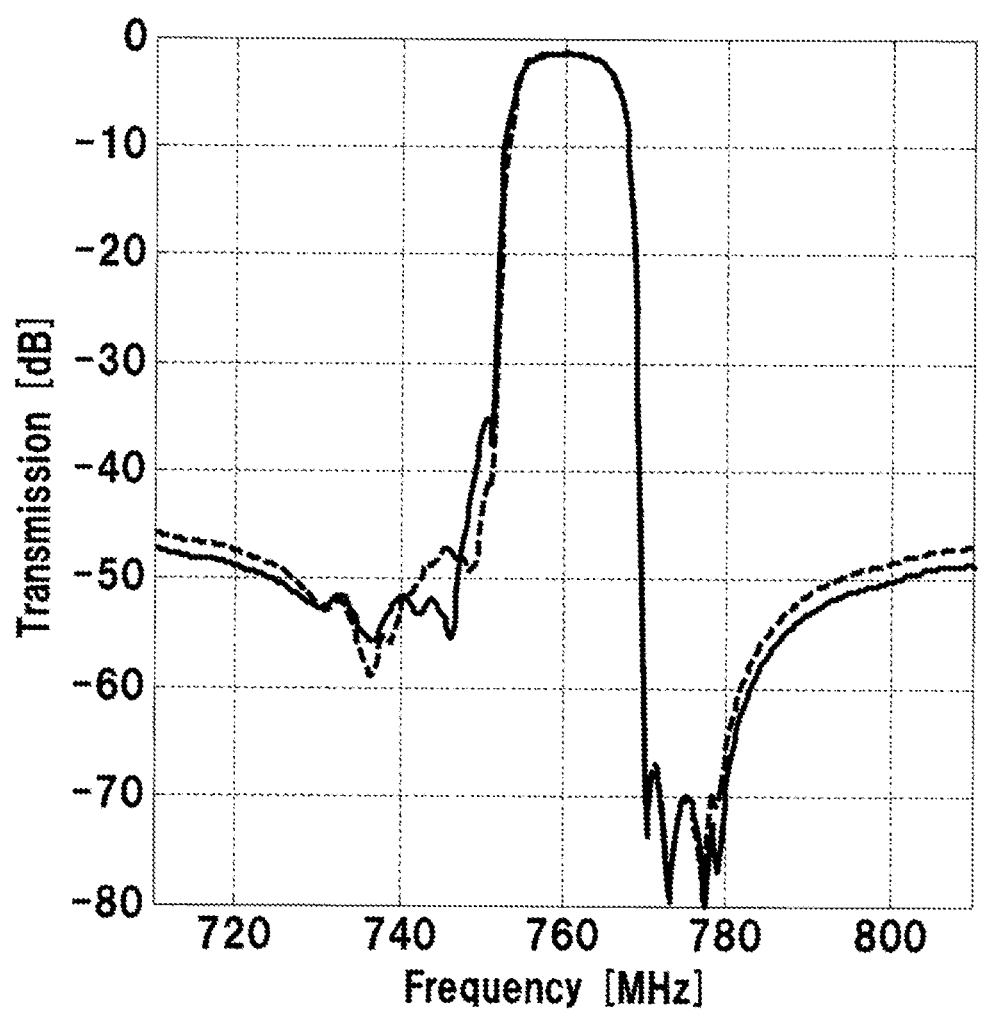
FIG. 7 is a view showing results of simulation computations of frequency characteristics of the SAW filter in FIG. 2 and a SAW filter in another modification.

The simulation results will be shown in FIG. 7. In FIG. 7, the abscissa shows frequencies (unit: MHz), and the ordinate shows pass characteristics (unit: dB). In the graph, a solid line indicates the results of the model of the SAW filter 51 in the present embodiment, and broken lines indicate the results of the model of the SAW filter in the modification.

As apparent also from the graph, it could be confirmed that the characteristic of the model of the present embodiment separating the GND terminals 55 was an excellent attenuation characteristic out of the passband compared with the characteristic of the model of the modification. This shows that the second parallel resonator 69B and the second capacity element 71B are connected in parallel in theory, but they are connected to separated routes between which the resistances, inductances and/or capacitances in the wiring lines are different from each other in the actual product. Further, for example, a plurality of attenuation poles of serial resonation are generated in accordance with the plurality of routes. As a result, for example it may become possible to improve the attenuation characteristic by the plurality of attenuation poles without increasing the number of parallel resonators 69.

Further, in the case of the multiplexer 101 in the present embodiment shown in FIG. 3 or another case where provision is not made of a route where the GND terminal 55A connected with the second parallel resonator 69B and the GND terminal 55B connected with the second capacity element 71B are electrically connected even on the mounting substrate 81 on which the SAW filter is to be mounted, the attenuation characteristic can be further raised.

Note that, in the above embodiment, the SAW filter 51 is one example of the acoustic wave filter. Each of the first serial resonance portion 61A and first parallel resonance portion 63A to third parallel resonance portion 63C is an example of the first resonance portion. Each of the first serial resonator 65A and first parallel resonator 69A to third parallel resonator 69C is an example of the first resonator. Each of the capacity element 67 and first capacity element 71A to third capacity element 71C is an example of the first capacity portion.

Further, from another viewpoint, the first serial resonance portion 61A is an example of the second resonance portion. The first serial resonator 65A is an example of the second resonator. The capacity element 67 is an example of the second capacity portion.

The plurality of GND terminals 55 are examples of the plurality of reference potential terminals. The first GND terminal 55A and second GND terminal 55B are examples of the two reference potential terminals which are not short-circuited with each other. The multiplexer 101 is an example of the acoustic wave device.

The external terminal 91A is an example of the antenna terminal. The SAW filter 51 is an example of one of the transmission filter and receiving filter, and the SAW filter 52 is an example of the other of the transmission filter and receiving filter.

The art in the present disclosure is not limited to the above embodiment and may be executed in various ways.

The acoustic wave is not limited to a SAW. For example, the acoustic wave may be a bulk wave propagating in the piezoelectric substrate or may be an elastic boundary wave propagating in a boundary portion between the piezoelectric substrate and an insulation layer covering the piezoelectric substrate (however, this is one type of SAW in a broad sense).

Figure 6:
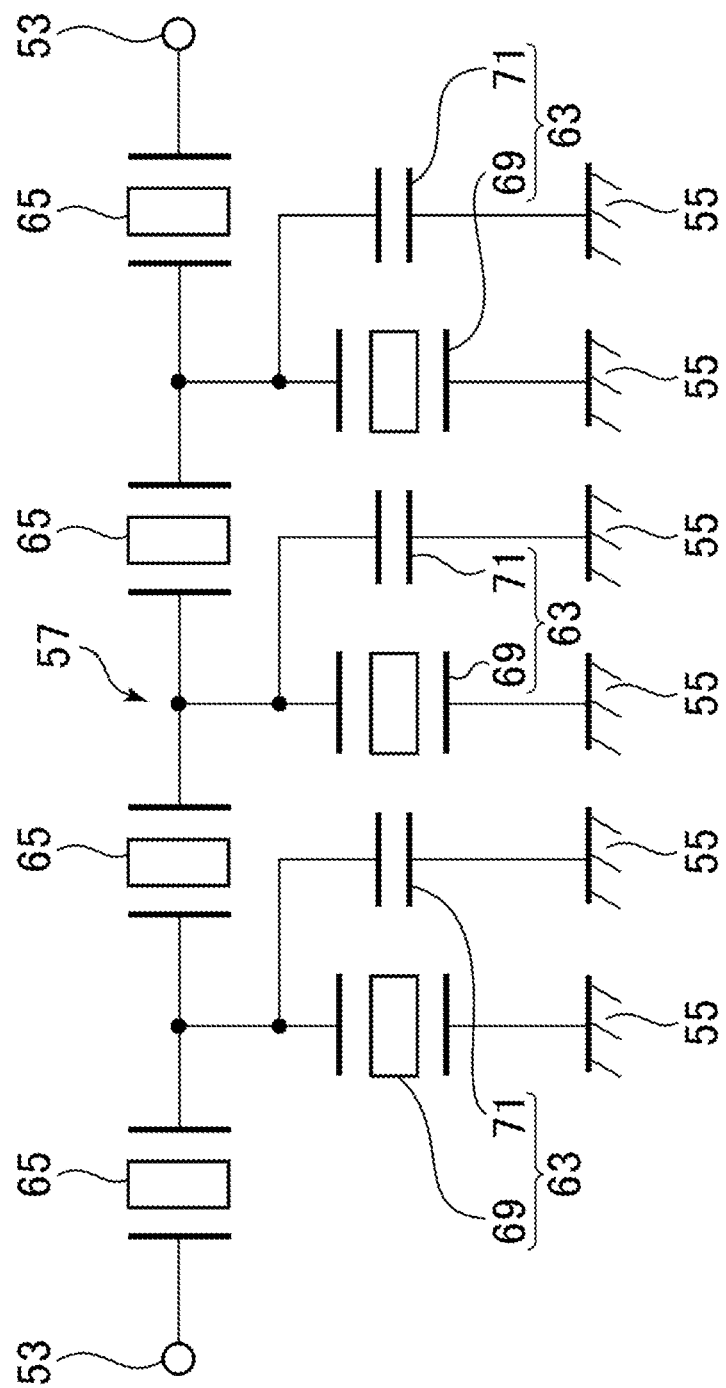
FIG. 6 is a schematic view showing a modification of the SAW filter.

In the embodiment, in only one of the plurality of parallel resonance portions, the parallel resonator and the capacity portion were connected to the reference potential terminals which were not short-circuited with each other. The number of such parallel resonance portions may be suitably set. Also, the connection positions thereof with respect to the serial arm may be suitably set. For example, as shown in FIG. 6, the parallel resonator 69 and the capacity element 71 may be connected to the GND terminals 55 which are not short-circuited with each other (further to the pads 87 to external terminals 91 which are not short-circuited with each other) in all parallel resonance portions 63 as well. In this case, for example, compared with the case where the parallel resonator 69 and the capacity element 71 are not short-circuited in one parallel resonance portion 63, the number of attenuation poles increases, so the attenuation amount is improved.

The configuration of the acoustic wave device shown in FIG. 3A is just one example. For example, the acoustic wave device (may be grasped as an acoustic wave filter) may be a wafer level packaged one in which a cover is provided on the upper surface of the piezoelectric substrate so as to cover the IDT electrode so that the IDT electrode is sealed, and the terminals (may be pad-shaped or columnar) are exposed from the upper surface of the cover.

From the present disclosure, the following art not taking up the issue of the magnitude of the capacitance of the capacity portion can be extracted:
An acoustic wave filter including
   a piezoelectric substrate,
   a serial arm on the piezoelectric substrate,
   one or more parallel arms on the piezoelectric substrate, configuring a ladder-type filter together with the serial arm, and
   a plurality of reference potential terminals on the piezoelectric substrate, wherein
   a first parallel arm which is any one of the one or more parallel arms includes a first resonator including an IDT electrode on the piezoelectric substrate and a pair of reflectors on the two sides of the IDT electrode and
   a first capacity portion connected in parallel with the first resonator,
the plurality of reference potential terminals include two reference potential terminals which are not short-circuited with each other,
the first resonator is connected to one of the two reference potential terminals, and
the first capacity portion is connected to the other of the two reference potential terminals.

REFERENCE SIGNS LIST

3 . . . piezoelectric substrate, 7 . . . IDT electrode, 9 . . . reflector, 57 . . . serial arm, 51 . . . SAW filter (acoustic wave filter), 59 (59A to 59C) . . . parallel arm, 61A . . . first serial resonance portion (second resonance portion), 63 (63A to 63C) . . . parallel resonance portion (first resonance portion), 69 (69A to 69C) . . . parallel resonator (first resonator), and 71 (71A to 71C) . . . capacity element (capacity portion).

The invention claimed is:

1. An acoustic wave filter, comprising:
a piezoelectric substrate,
a serial arm comprising one or more serial resonance portions on the piezoelectric substrate, and
one or more parallel resonance portions on the piezoelectric substrate, configuring a ladder-type filter together with the serial arm, wherein:
a first resonance portion which is any one of the one or more parallel resonance portions comprises
a first resonator comprising an IDT electrode on the piezoelectric substrate and a pair of reflectors on the two sides of the IDT electrode and a first capacity portion connected in parallel with the first resonator,
a capacitance of the first capacity portion is 0.8 time or more of a capacitance of the IDT electrode in the first resonator, and
a difference between an anti-resonance frequency and a resonance frequency of the first resonance portion is smaller than a difference between an anti-resonance frequency and a resonance frequency of the first resonator, and
the first capacity portion comprises an IDT electrode on the piezoelectric substrate with an electrode finger pitch of which is smaller than the electrode finger pitch of the IDT electrode in the first resonator.

2. The acoustic wave filter according to claim 1, wherein the capacitance of the first capacity portion is 1.69 time or less of the capacitance of the IDT electrode in the first resonator.

3. A multiplexer comprising:
an antenna terminal,
a transmission filter which filters a transmission signal and outputs the result to the antenna terminal, and
a receiving filter which filters a reception signal from the antenna terminal, wherein
at least one of the transmission filter and the receiving filter comprises the acoustic wave filter according to claim 1.

4. A communication apparatus comprising:
an antenna,
the multiplexer according to claim 3, the antenna terminal of which is connected to the antenna, and
an IC which is connected to the transmission filter and the receiving filter.

5. An acoustic wave filter, comprising:
a piezoelectric substrate,
a serial arm comprising one or more serial resonance portions on the piezoelectric substrate, and
one or more parallel resonance portions on the piezoelectric substrate, configuring a ladder-type filter together with the serial arm, wherein:
a first resonance portion which is any one of the one or more parallel resonance portions comprises
a first resonator comprising an IDT electrode on the piezoelectric substrate and a pair of reflectors on the two sides of the IDT electrode and a first capacity portion connected in parallel with the first resonator,
a capacitance of the first capacity portion is 0.8 time or more of a capacitance of the IDT electrode in the first resonator, and
a difference between an anti-resonance frequency and a resonance frequency of the first resonance portion is smaller than a difference between an anti-resonance frequency and a resonance frequency of the first resonator,
a second resonance portion which is one of the one or more serial resonance portions comprises a second resonator comprising an IDT electrode on the piezoelectric substrate and a pair of reflectors on the two sides of this IDT electrode and
a second capacity portion connected in parallel with the second resonator, and
a ratio of a capacitance of the second capacity portion relative to a capacitance of the IDT electrode in the second resonator is smaller than a ratio of the capacitance of the first capacity portion relative to the capacitance of the IDT electrode in the first resonator.

6. A multiplexer comprising:
an antenna terminal,
a transmission filter which filters a transmission signal and outputs the result to the antenna terminal, and
a receiving filter which filters a reception signal from the antenna terminal, wherein
at least one of the transmission filter and the receiving filter comprises the acoustic wave filter according to claim 5.

7. A communication apparatus comprising:
an antenna,
the multiplexer according to claim 6, the antenna terminal of which is connected to the antenna, and
an IC which is connected to the transmission filter and the receiving filter.

8. The acoustic wave filter according to claim 5, wherein the capacitance of the first capacity portion is 1.69 time or less of the capacitance of the IDT electrode in the first resonator.

9. An acoustic wave filter, comprising:
a piezoelectric substrate,
a serial arm comprising one or more serial resonance portions on the piezoelectric substrate, and
one or more parallel resonance portions on the piezoelectric substrate, configuring a ladder-type filter together with the serial arm, wherein:
a first resonance portion which is any one of the one or more parallel resonance portions comprises
a first resonator comprising an IDT electrode on the piezoelectric substrate and a pair of reflectors on the two sides of the IDT electrode and a first capacity portion connected in parallel with the first resonator,
a capacitance of the first capacity portion is 0.8 time or more of a capacitance of the IDT electrode in the first resonator, and
a difference between an anti-resonance frequency and a resonance frequency of the first resonance portion is smaller than a difference between an anti-resonance frequency and a resonance frequency of the first resonator, and
a plurality of reference potential terminals on the piezoelectric substrate, wherein the plurality of reference potential terminals comprises two reference potential terminals which are not short-circuited with each other,
the first resonator is connected to one of the two reference potential terminals, and the first capacity portion is connected to the other of the two reference potential terminals.

10. An acoustic wave device, comprising:
the acoustic wave filter according to claim 9 and
a mounting substrate on which the acoustic wave filter is mounted, wherein
the mounting substrate comprises
a plurality of pads bonded to the plurality of reference potential terminals,
a plurality of wiring lines connected to the plurality of pads, and
a plurality of external terminals connected through the plurality of wiring lines with the plurality of pads,
the plurality of pads comprise two pads which are not short-circuited with each other in a range from the plurality of pads up to the plurality of external terminals,
one of the two reference potential terminals is connected to one of the two pads, and
the other of the two reference potential terminals is connected to the other of the two pads.

11. A multiplexer comprising:
an antenna terminal,
a transmission filter which filters a transmission signal and outputs the result to the antenna terminal, and
a receiving filter which filters a reception signal from the antenna terminal,
wherein
at least one of the transmission filter and the receiving filter comprises the acoustic wave filter according to claim 9.

12. A communication apparatus comprising:
an antenna,
the multiplexer according to claim 11, the antenna terminal of which is connected to the antenna, and
an IC which is connected to the transmission filter and the receiving filter.

13. The acoustic wave filter according to claim 9, wherein the capacitance of the first capacity portion is 1.69 time or less of the capacitance of the IDT electrode in the first resonator.

* * * * *